United States Patent
Takeda et al.

(10) Patent No.: US 6,259,152 B1
(45) Date of Patent: Jul. 10, 2001

(54) HYBRID LEADFRAME HAVING CONDUCTIVE LEADS LESS DEFORMABLE AND SEMICONDUCTOR DEVICE USING THE SAME

(75) Inventors: Hiromitsu Takeda; Michihiko Ichinose; Takehito Inaba; Ken Fukamachi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/303,281

(22) Filed: Apr. 30, 1999

(30) Foreign Application Priority Data

May 1, 1998 (JP) .................................................. 10-122419

(51) Int. Cl.[7] .................................................. H01L 23/495
(52) U.S. Cl. .......................................... 257/666; 257/676
(58) Field of Search .................................. 257/666, 676, 257/669, 674, 783

(56) References Cited

U.S. PATENT DOCUMENTS

| 5,545,920 | | 8/1996 | Russell . |
| 5,563,443 | * | 10/1996 | Beng et al. . |
| 5,648,681 | * | 7/1997 | Takashima et al. . |
| 5,804,871 | * | 9/1998 | Macda . |
| 6,016,003 | * | 1/2000 | Uemura . |
| 6,040,620 | * | 3/2000 | Sugimoto et al. . |
| 6,060,770 | * | 5/2000 | Nakamura et al. . |

FOREIGN PATENT DOCUMENTS

| 10-22442 | 1/1998 | (JP) . |
| 10-256457 | 9/1998 | (JP) . |

\* cited by examiner

Primary Examiner—Sheila V. Clark
(74) Attorney, Agent, or Firm—Hutchins, Wheeler & Dittmar (57) ABSTRACT

A hybrid leadframe has first conductive leads extending into space over a semiconductor chip and second conductive leads outside the space, the first conductive leads and the second conductive leads are connected through bonding wires to bonding pads on the semiconductor chip, and the first conductive leads are directly adhered to insulating adhesive compound layers spread on predetermined area of the upper surface of the semiconductor device, wherein the second conductive leads are bifurcated so that one of the bifurcated portions is connected through the bonding wire to the bonding pad and the other bifurcated portion is adhered to the insulating adhesive compound layers so as to enhance the stability of the second conductive lead.

16 Claims, 6 Drawing Sheets

HYBRID LEADFRAME HAVING CONDUCTIVE LEADS LESS DEFORMABLE AND SEMICONDUCTOR DEVICE USING THE SAME

FIELD OF THE INVENTION

This invention relates to a packaging technology for a semiconductor chip and, more particularly, to a hybrid leadframe assembled with a semiconductor chip.

DESCRIPTION OF THE RELATED ART

Figure 1:
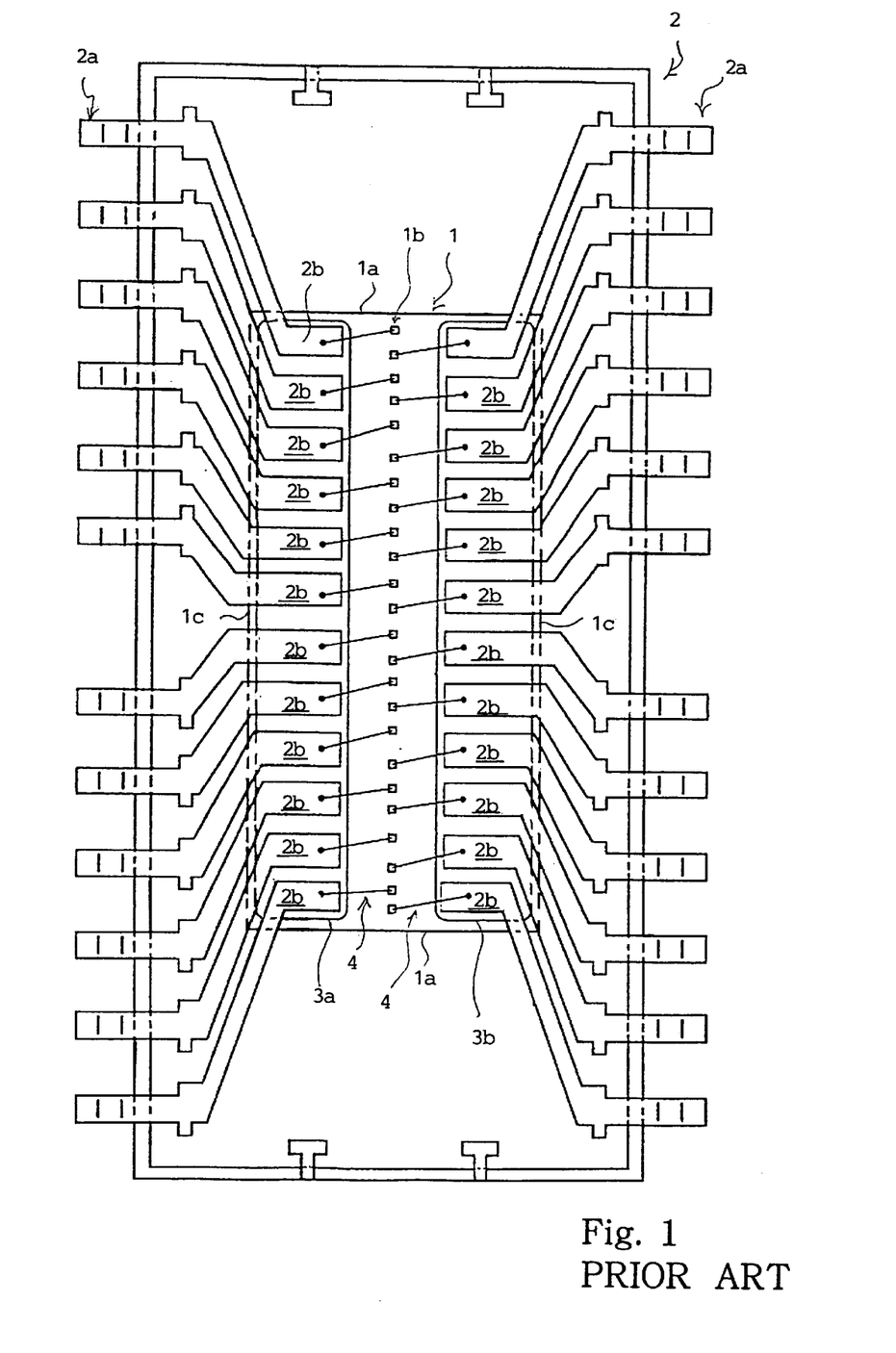
FIG. 1 is a plane view showing the prior art leadframe-over-chip configuration.

Various leadframes have been proposed for semiconductor chips. A kind of leadframes has a structure called as "Leadframe-Over-Chip" configuration. FIG. 1 illustrates a semiconductor chip 1 assembled with a leadframe 2. The leadframe 2 has the leadframe-over-chip configuration.

The leadframe 2 comprises plural conductive leads 2a arranged on both sides of the semiconductor chip 1. The conductive leads 2a extend over an upper surface of the semiconductor chip 1, and inner end portions 2b of the conductive leads 2a are bent so as to be parallel to end lines 1a of the semiconductor chip 1. The inner end portions 2b are called as "stitch", and are arranged at intervals over both side areas of the upper surface of the semiconductor chip 1. Bonding pads 1b are formed in a central area of the upper surface of the semiconductor chip 1 along side lines 1c, and are connected to an integrated circuit (not shown) inside the semiconductor chip 1.

The semiconductor chip 1 is bonded to the prior art leadframe 2 by means of a pair of bonding tapes 3a/3b. Each bonding tape 3a/3b has insulating adhesive compound layers on both surface thereof, and the lower insulating adhesive compound layers are respectively bonded to the side areas of the upper surface of the semiconductor chip 1. The inner end portions 2b are bonded to the upper insulating adhesive compound layers, and the bonding pads 1b are exposed to the gap between the bonding tapes 3a and 3b. Bonding wires 4 of gold are connected between the inner end portions 2b and the bonding pads 1b, and the conductive leads 2a are electrically connected through the bonding wires 4 and the bonding pads 1b to the integrated circuit.

Thus, the leadframe-over-chip configuration is featured by the inner end portions 2b over the semiconductor chip 1. The manufacturer increases the bonding pads 1b for providing a large number of signal paths to the integrated circuit, and the upper surface of the semiconductor chip 1 becomes too narrow to arrange the inner end portions 2b over the upper surface. When the manufacturer integrates electric circuits on a small semiconductor chip 1, the upper surface may be too narrow to arrange all the inner end portions 2b thereover. In this situation, Russell proposes another prior art leadframe in U.S. Pat. No. 5,545,920.

Figure 2:
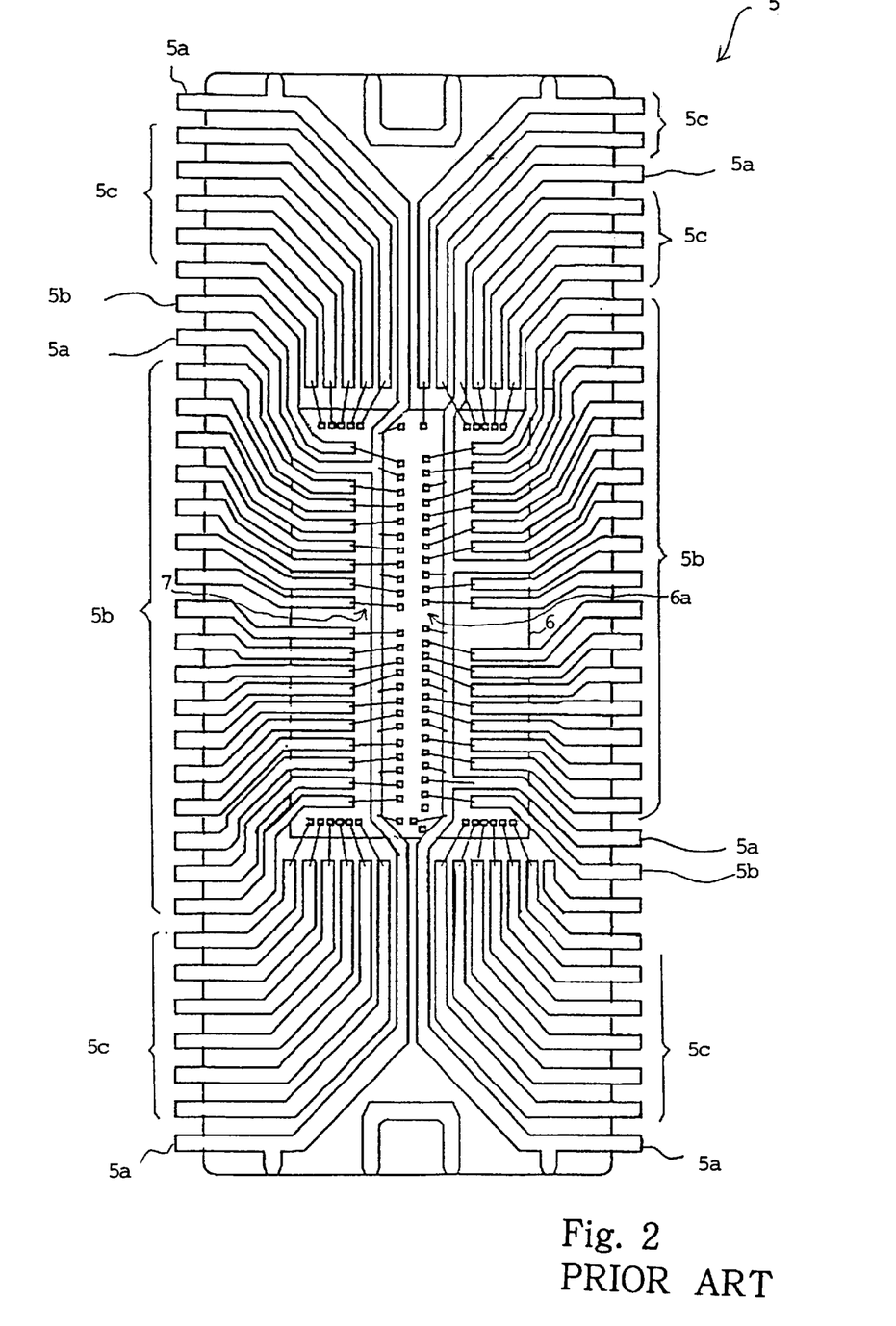
FIG. 2 is a plane view showing the configuration of the prior art hybrid leadframe disclosed in U.S Pat. No. 5,545,920.

FIG. 2 illustrates the prior art leadframe disclosed in the U.S. Patent. Conductive leads 5 are arranged around a semiconductor chip 6. The conductive leads 5 are broken down into three categories. The conductive leads in the first category are labeled with reference 5a, and distribute electric power to an integrated circuit inside the semiconductor chip 6. For this reason, plural bonding pads 6a are connected to the conductive leads 5a through bonding wires 7. The conductive leads 5a are bonded to the semiconductor chip 6 by means of insulating adhesive compound (not shown).

The conductive leads in the second category are labeled with reference 5b. The conductive leads 5b have inner end portions located over the semiconductor chip 6, and are bonded to the semiconductor chip 6 by means of the insulating adhesive compound (not shown). Electric signals are propagated through the conductive leads 5b between the integrated circuit and an conductive pattern on a circuit board (not shown), and, for this reason, the conductive leads 5b are connected through the bonding wires 7 to the bonding pads 6a, respectively.

The conductive leads in the third category are labeled with reference 5c, and electric signals are also propagated through the conductive leads 5c between the conductive pattern on the circuit board and the integrated circuit. The conductive leads 5c are also connected through the bonding wires 7 to the bonding pads 6a, respectively. However, the inner end portions of the conductive leads 5c are outside the semiconductor chip 6, and are not bonded to the semiconductor chip 6. Thus, Russell arranges the conductive leads 5c outside the semiconductor chip 6 so as to increase the conductive leads 5. The prior art leadframe proposed by Russell is called as "hybrid leadframe-over-chip configuration".

The first problem inherent in the prior art hybrid leadframe-over-chip configuration is deformation of the conductive leads 5c during a transfer to the assembling apparatus and the assembling work. Although the conductive leads 5b are bonded to the adhesive compound layers of the bonding tapes, the conductive leads 5c are separated from one another, and are liable to be deformed, i.e., bent or twisted. If the manufacturer uses the prior art hybrid leadframe-over-chip for a small semiconductor chip 6, the manufacturer prolongs the conductive leads 5c, and the prolonged conductive leads 5c are much liable to be deformed.

The second problem is incomplete bonding to the bonding pads 6a. The conductive leads 5c are separated from one another, and the inner end portions are not always on a level with the conductive leads 5b. The bonding machine is usually regulated to the inner end portions of the conductive leads 5b, and some bonding wires 7 are incompletely connected to the inner end portions of the conductive leads 5c.

The third problem is incomplete packaging. Even if the bonding wires are completely bonded to the inner end portions of the conductive leads 5c, the conductive leads are still liable to float and sink. While the manufacturer is sealing the prior art hybrid leadframe in synthetic resin, some conductive leads 5c float on the melted synthetic resin, and are exposed to the outside of the plastic package. Moreover, if a solid piece of synthetic resin is left in a molding die, the solid piece may urge the conductive lead 5c and push out the bonding wire from the cavity. Then, the molding die is closed, and the bonding wire is cracked.

SUMMARY OF THE INVENTION

It is therefore an important object of the present invention to provide a leadframe, which is free from the problems inherent in the prior art hybrid leadframe.

It is also an important object of the present invention to provide a semiconductor device, in which the leadframe is used for a semiconductor chip.

In accordance with one aspect of the present invention, there is provided a leadframe assembled with a semiconductor chip comprising first conductive leads respectively having first inner end portions projecting into a space over an upper surface of the semiconductor chip and adhered to the upper surface by means of insulating adhesive compound, second conductive leads each having a second inner end portion outside the space and a supporting portion projecting into the space so as to be adhered to the insulating adhesive compound and bonding wires connected between bonding pads formed on the upper surface of the semiconductor chip and the first inner end portions and the second inner end portions of the second conductive leads.

In accordance with another aspect of the present invention, there is provided a semiconductor device comprising a semiconductor chip having an upper surface where bonding pads are formed, and a leadframe assembled with the semiconductor chip and including first conductive leads respectively having first inner end portions projecting into a space over an upper surface of the semiconductor chip and adhered to the upper surface by means of insulating adhesive compound, second conductive leads each having a second inner end portion outside the space and a supporting portion projecting into the space so as to be adhered to the insulating adhesive compound, and bonding wires connected between bonding pads formed on the upper surface of the semiconductor chip and the first inner end portions and the second inner end portions of the second conductive leads.

BRIEF DESCRIPTION OF THE DRAWINGS

The features and advantages of the leadframe and the semiconductor device will be more clearly understood from the following description taken in conjunction with the accompanying drawings in which.

DESCRIPTION OF THE PREFERRED EMBODIMENTS

First Embodiment

Figure 3:
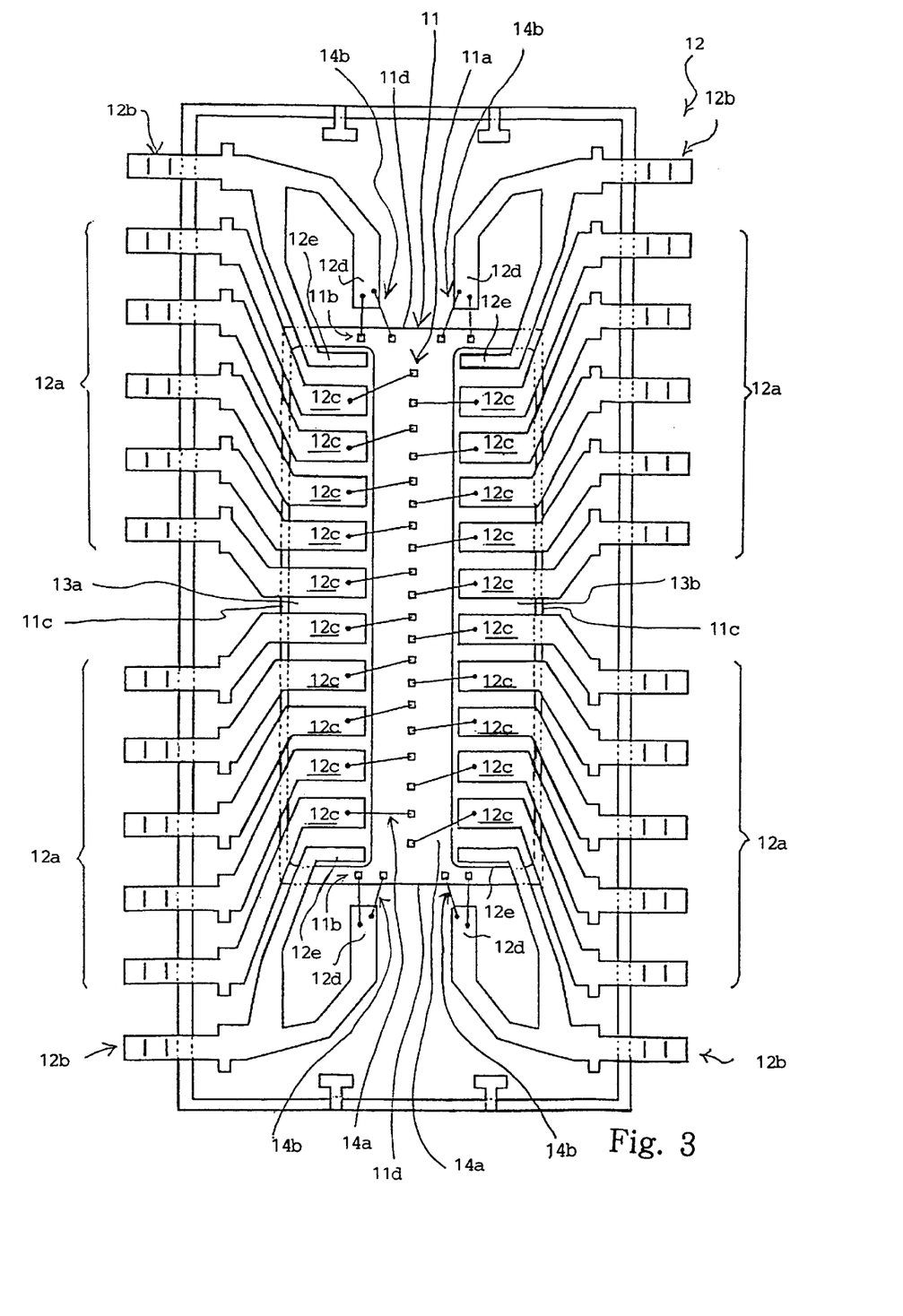
FIG. 3 is a plane view showing the configuration of a hybrid leadframe according to the present invention.

Referring to FIG. 3 of the drawings, a semiconductor chip 11 is assembled with a hybrid leadframe 12 embodying the present invention, and the semiconductor chip 11 and the hybrid leadframe 12 form parts of a semiconductor device. Although the semiconductor chip 11 and the hybrid leadframe 12 are to be sealed in a plastic package, the plastic package is eliminated from the semiconductor device shown in FIG. 3 so as to be seen the hybrid leadframe 12.

The semiconductor chip 11 has an integrated circuit (not shown) inside thereof and plural bonding pads 11a/11b on the upper surface thereof. The bonding pads 11a are arranged at intervals in a direction parallel to the side lines 11c of the semiconductor chip 11, and the bonding pads 11b are arranged along the end lines 11d of the semiconductor chip 11. The bonding pads 11b do not allow a conductive lead to extend into space over the upper surface of the semiconductor chip 11, and, accordingly, the hybrid leadframe 12 is used for the semiconductor chip 11.

The hybrid leadframe 12 includes two rows of conductive leads 12a/12b. The conductive leads 12a are assigned to electric signals, and electric power is distributed through the other conductive leads 12b to the integrated circuit. The conductive leads 12a/12b sidewardly projects, and have respective inner end portions 12c/12d called as "stitch". The inner end portions 12c are in the space over the upper surface of the semiconductor chip 11. However, the inner end portions 12d are outside the space. The conductive leads 12b are bifurcated. One of the branched portions of each conductive lead 12b has the inner end portion 12d called as "stitch". The other branched portion 12e is multiply bent so as to extend into the space over the upper surface of the semiconductor chip 11.

The semiconductor device further comprises a pair of bonding tapes 13a/13b. Insulating adhesive compound is spread over both surfaces of each bonding tape 13a/13b, and the bonding tapes 13a/13b are adhered to side areas of the upper surface between the rows of bonding pads 1b. The bonding pads 11a are exposed to the gap between the bonding tapes 13a and 13b. The inner end portions 12c and the branched portion 12e are adhered to the insulating adhesive compound layers of the bonding tapes 13a/13b. Thus, all the inner end portions 12c/12d are directly or indirectly connected to the semiconductor chip 11.

The inner end portions 12c are electrically connected to the bonding pads 11a by means of conductive bonding wires 14a, and the inner end portions 12d are electrically connected to the bonding pads 11b by means of conductive bonding wires 14b.

As will be understood from the foregoing description, the branched portions 12e prevent the inner end portions 12d from undesirable force causative of the deformation and the movement in the up-and-down direction, and keep the inner end portions 12d substantially on a level with the inner end portions 12c. For this reason, the bonding wires 14b are completely bonded to the inner end portions 12d, and are hardly separated therefrom. Moreover, the branched portions 12e do not allow a residual solid piece of synthetic resin to push out the bonding wires 14b from the cavity of a molding die (not shown), and the molding die does not pinch the bonding wires 14b.

Second Embodiment

Figure 4:
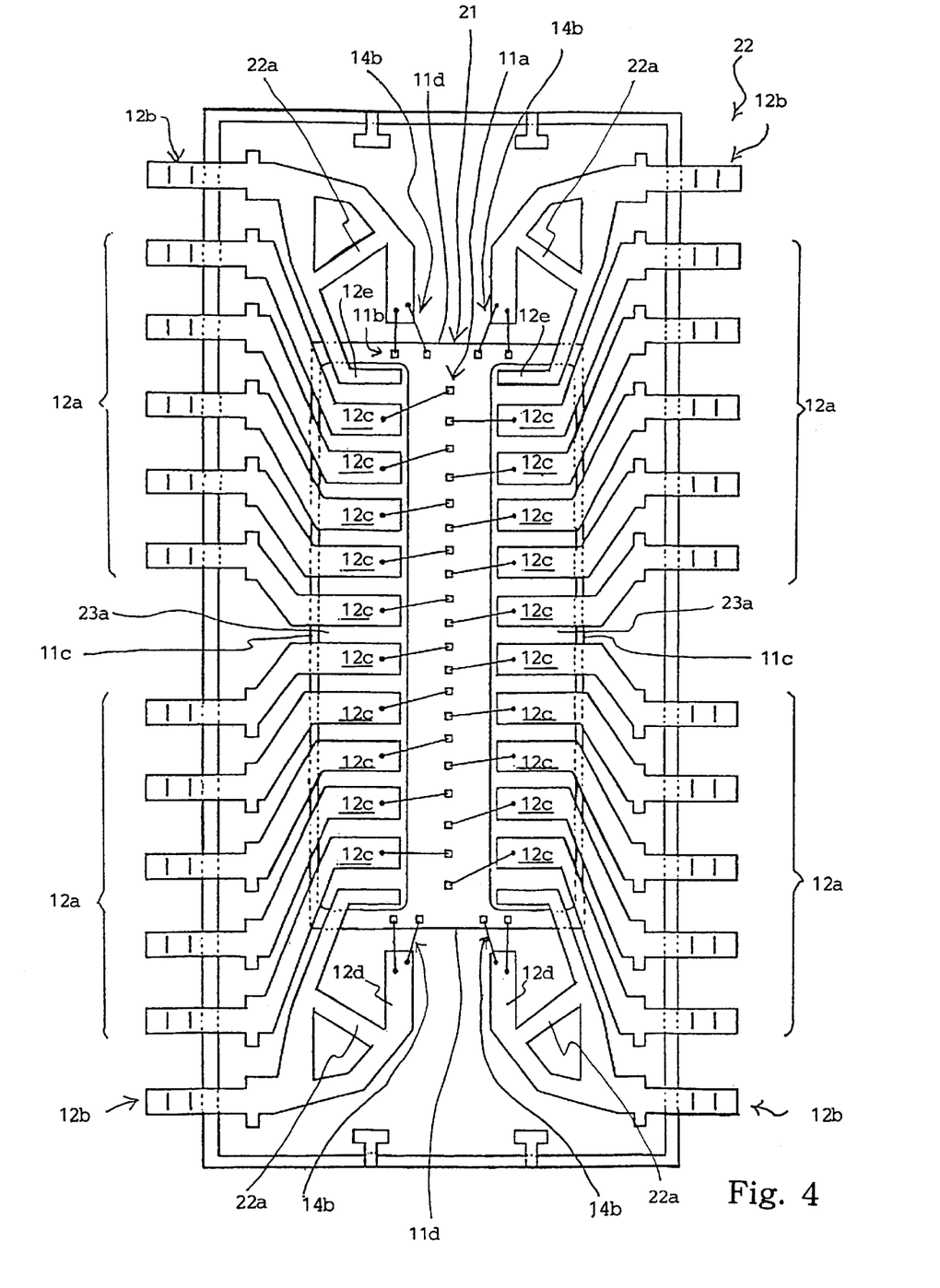
FIG. 4 is a plane view showing the configuration of another hybrid leadframe according to the present invention.

Turning to FIG. 4 of the drawings, another semiconductor device embodying the present invention comprises a semiconductor chip 21, a hybrid leadframe 22, bonding tapes 23a/23b and bonding wires 24a/24b. The semiconductor chip 21, the hybrid leadframe 22, the bonding tapes 23a/23b and the bonding wires 24a/24b are similar to those of the first embodiment expect reinforcing bars 22a. For this reason, portions and pads of these components 21/22 are labeled with the same references designating corresponding portions and pads of the first embodiment without detailed description.

The reinforcing bars 22a are provided between the branched portions 12e and 12d of the conductive leads 12b, respectively. Each of the reinforcing bars 22a is integral with the associated branched portions 12e/12d, and increases the resistance of the branched portion 12d against the deformation. Thus, the hybrid leadframe 22 achieves all the advantages of the first embodiment.

Third Embodiment

Figure 5:
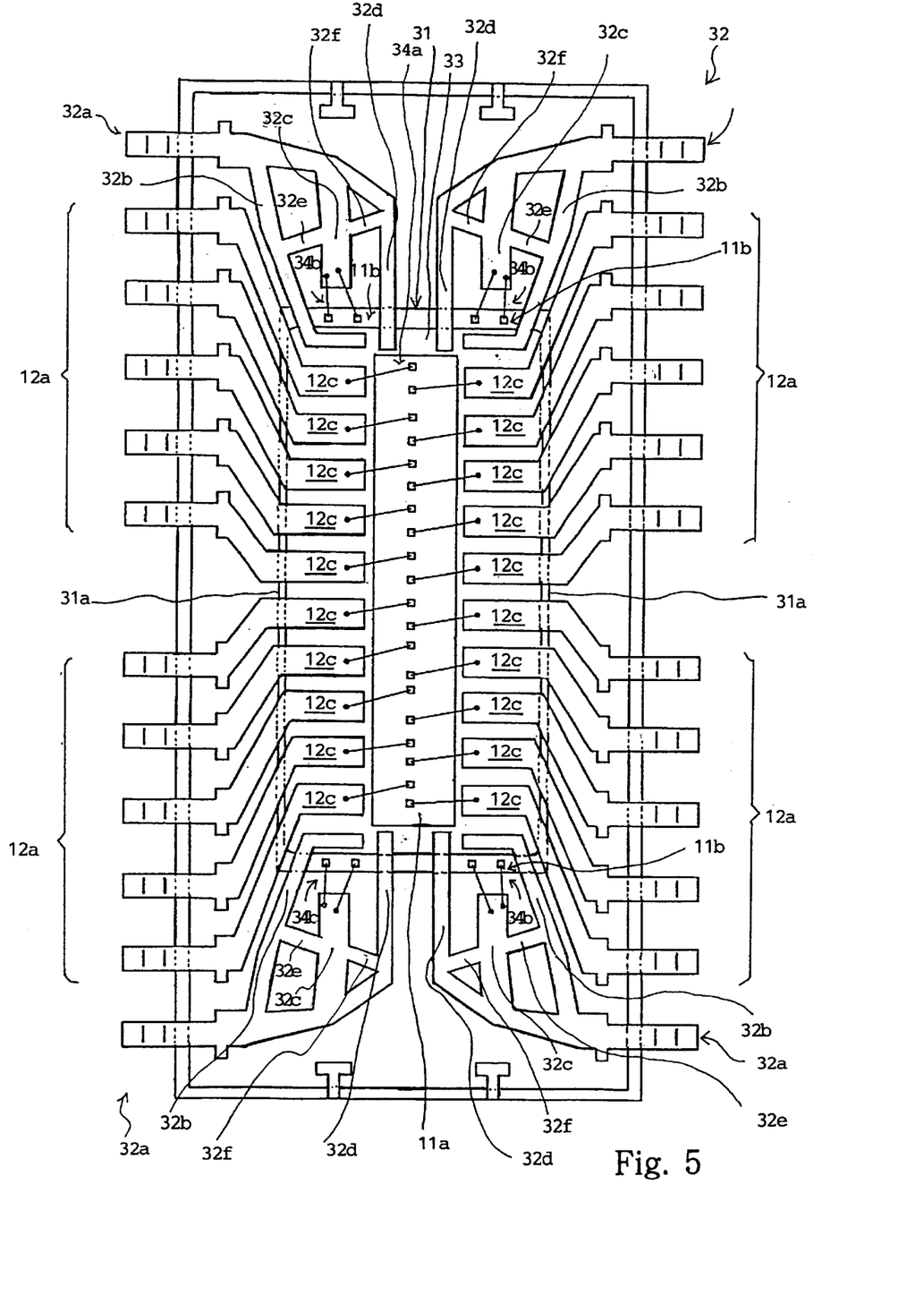
FIG. 5 is a plane view showing the configuration of yet another hybrid leadframe according to the present invention.

Turning to FIG. 5, yet another semiconductor device embodying the present invention comprises a semiconductor chip 31, a hybrid leadframe 32, a bonding tape 33 and bonding wires 34a/34b. The semiconductor chip 31 and the hybrid leadframe 32 are similar to the semiconductor chip 11 and the hybrid leadframe 12 except conductive leads 32a, and the pair of bonding tapes 13a/13b are replaced with the single bonding tape 33. For this reason, the other component members are labeled with the same references designating corresponding component members of the first embodiment without detailed description.

The bonding tape 33 is in a loop, and insulating adhesive compound is spread over both surfaces. The bonding tape 33 is adhered to the upper surface of the semiconductor chip 31, and the bonding pads 11a and the bonding pads 11b are inside the loop and outside the loop, respectively. The inner end portions 12c are adhered to the bonding tape 33 at intervals along the side lines 31a.

The conductive lead 32a is branched into three portions 32b/32c/32d, and reinforcing bars 32e/32f are provided between the branched portions 32b, 32c and 32d. The branched portions 32b and 32d extend into the space over the upper surface of the semiconductor chip 31, and are adhered to the bonding tape 33. The branched portion 32c remains outside of the space, and is connected through the bonding wires 34b to the bonding pads 11b. Thus, each branched portion 32c is supported through the pair of branched portions 32b/32d by the semiconductor chip 31, and the branched portion is less deformable rather than the hybrid leadframes 12/22. Although the pairs of branched portions 32b/32d require the bonding area wider than that of the second embodiment, the looped bonding tape 33 offers the wide bonding area, and the pairs of the branched portions 32b/32d are adhered to the bonding tape without any short-circuit.

Fourth Embodiment

Figure 6:
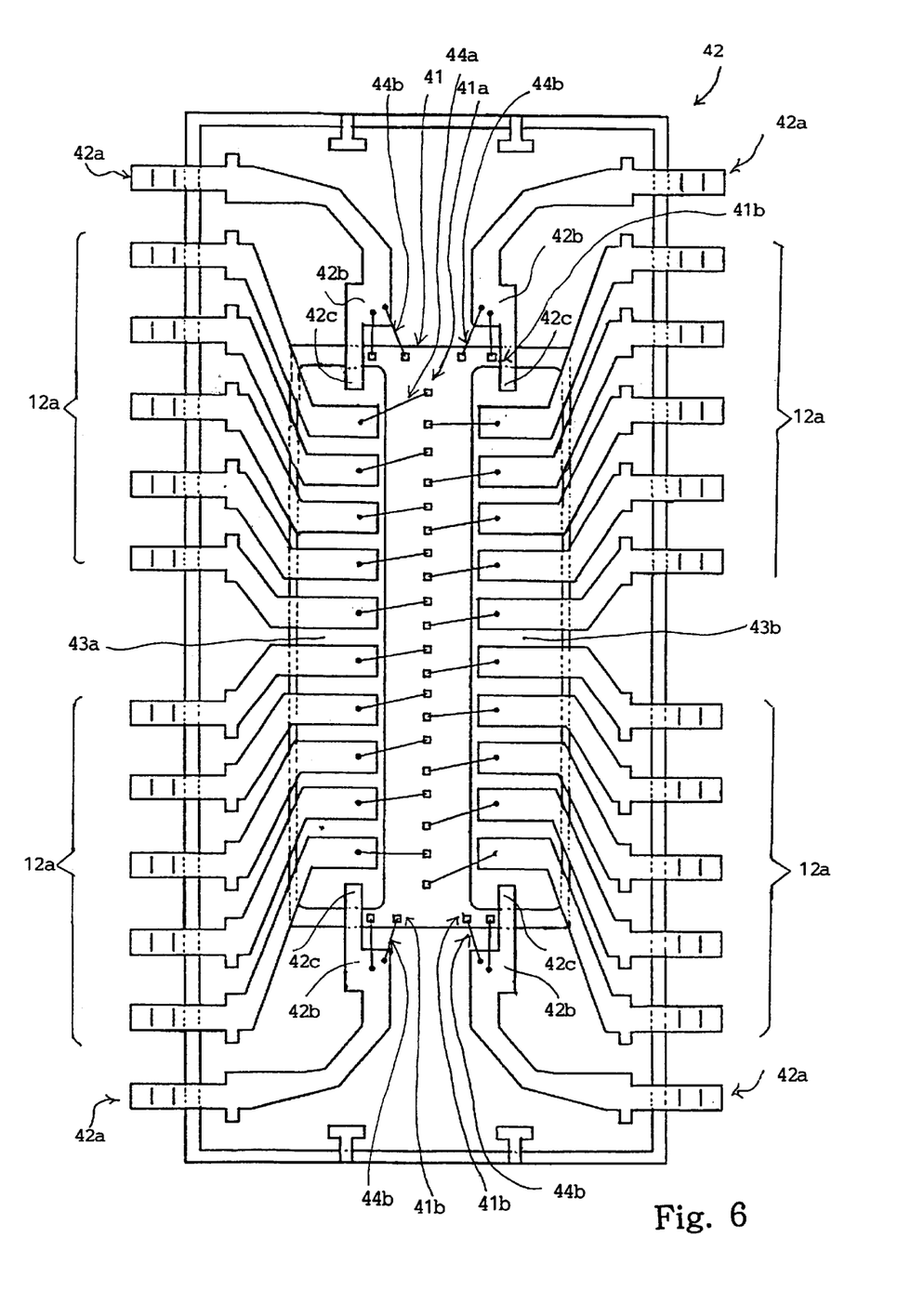
FIG. 6 is a plane view showing the configuration of still another hybrid leadframe according to the present invention.

Turning to FIG. 6 of the drawings, still another semiconductor device embodying the present invention comprises a semiconductor chip 41, a hybrid leadframe 42, bonding tapes 43a/43b and bonding wires 44a/44b. Bonding pads 41a/41b are arranged on the upper surface of the semiconductor chip 41 as similar to those of the semiconductor chip 11. The hybrid leadframe 42 is similar to the hybrid leadframe 12 except conductive leads 42a, and other components are labeled with the same references designating corresponding components of the hybrid leadframe 12.

The conductive leads 42a have respective inner end portions 42b called as "stitch", and are outside the space over the upper surface of the semiconductor chip 41. The bonding wires 44b are connected between the inner end portions 42b and the associated bonding pads 44a, respectively. The conductive lead 42a further has a projection 42c narrower than the inner end portions 42. The narrow projections 42c extend into the space over the upper surface, and are adhered to the bonding tapes 43a/43b. The projections 42c do not allow the inner end portions 42b to be deformed, and keep the inner end portions 42b on a level with the inner end portions 12c.

The projections 42c consume the bonding area narrower than that of the first, second and third embodiments. For this reason, the hybrid leadframe 42 is suitable to a small-sized semiconductor device.

As will be appreciated from the foregoing description, the branched portions 12e/32b and 32d and the projection 42c make the inner end portions 12d/32c/42b less deformed. The operators easily handle the hybrid leadframes 12/22/32/42 during the assembly. In fact, the percent defective due to the deformed lead was from zero percent to 1 percent.

Moreover, the branched portions 12e/32b/32d and the projections 42c make the inner end portions 12d/32c/42b on a level with the inner end portions 12c, and the bonding wires 14b/34b/44b are perfectly bonded to the inner end portions 12d/32c/42b. This results in further reduction of the percent defective.

The branched portions 12e/32b/32d and the projections 42c do not allow a residual solid piece of synthetic resin to push out the bonding wires 14b/34b/44b from the cavity of the molding die. The percent defective due to the damaged wires was of the order of 1 percent in the prior art hybrid leadframe. The branched portions 12e/32b/32d reduce the percent defective to zero. Conventionally, the manufacturer carried out a cleaning work on the inner surface of the molding die after every molding operation. The manufacturer decreases the cleaning work after every other molding operation by virtue of the branched portions 12e/32b/32d. The assembling cost is surely reduced.

Finally, even if the conductive leads 12b/32a/42a are assigned a power supply, the branched portions 12e/32b/32d and the reinforcing bars 22a/32e/32f increase the cross section of the current path, and, accordingly, reduces the resistance. For this reason, the branched portions 12e/32b/32d and the reinforcing bars 22a/32e/32f is desirable for the power distribution to the integrated circuit.

Although particular embodiments of the present invention have been shown and described, it will be apparent to those skilled in the art that various changes and modifications may be made without departing from the spirit and scope of the present invention.

What is claimed is:

1. A leadframe assembled with a semiconductor chip, comprising:

first conductive leads respectively having first inner end portions projecting into a first space over an upper surface of said semiconductor chip and adhered to said upper surface by means of an insulating adhesive compound;

second conductive leads each having a second inner end portion disposed outside of said first space and a supporting portion projecting into said first space so as to be adhered to said insulating adhesive compound; and bonding wires connected between bonding pads formed on at least a central region of said upper surface of said semiconductor chip that is not covered by said insulating adhesive compound, and said first inner end portions of said first conductive leads and the second inner end portions of said second conductive leads.

2. A leadframe assembled with a semiconductor chip, comprising:

first conductive leads respectively having first inner end portions projecting into a space over an upper surface of said semiconductor chip and adhered to said upper surface by means of insulating adhesive compound;

second conductive leads each having a second inner end portion outside said space and a supporting portion projecting into said space so as to be adhered to said insulating adhesive compound; and bonding wires connected between bonding pads formed on said upper surface of said semiconductor chip and said first inner end portions and the second inner end portions of said second conductive leads, in which said insulating adhesive compound is spread over side areas on said upper surface, and said bonding pads are broken down into a first bonding pad group arranged on a central area between said side areas and connected through said bonding wires to said first inner end portions, and a second bonding group arranged on both sides of said central and side areas and connected through said bonding wires to said second inner end portions.

3. The leadframe as set forth in claim 2, in which each of said second inner end portions is connected to at least a respective one of a plurality of bonding pads of said second bonding pad group.

4. A leadframe assembled with a semiconductor chip, comprising:

first conductive leads respectively having first inner end portions projecting into a space over an upper surface of said semiconductor chip and adhered to said upper surface by means of insulating adhesive compound;

second conductive leads each having a second inner end portion outside said space and a supporting portion projecting into said space so as to be adhered to said insulating adhesive compound; and bonding wires connected between bonding pads formed on said upper surface of said semiconductor chip and said first inner end portions and the second inner end portions of said second conductive leads, in which each of said second conductive leads further has a reinforcing bar connected between said second inner end portion and said supporting portion.

5. The leadframe as set forth in claim 4, in which said insulating adhesive compound is spread over side areas on said upper surface, and said bonding pads are broken down into a first bonding pad group arranged on a central area between said side areas and connected through said bonding wires to said first inner end portions, and a second bonding group arranged on both sides of said central and side areas and connected through said bonding wires to said second inner end portions.

6. The leadframe as set forth in claim 5, in which each of said second inner end portions is connected to at least a respective one of a plurality of bonding pads of said second bonding pad group.

7. A leadframe assembled with a semiconductor chip, comprising:

first conductive leads respectively having first inner end portions projecting into a space over an upper surface of said semiconductor chip and adhered to said upper surface by means of insulating adhesive compound;

second conductive leads each having a second inner end portion outside said space and a supporting portion projecting into said space so as to be adhered to said insulating adhesive compound; and bonding wires connected between bonding pads formed on said upper surface of said semiconductor chip and said first inner end portions and the second inner end portions of said second conductive leads, in which each of said second conductive leads further has another supporting portion projecting into said space so as to be adhered to said insulating adhesive compound and reinforcing portions connected between said supporting portion and said second inner end portion and between said another supporting portion and said second inner end portion.

8. The leadframe as set forth in claim 7, in which said supporting portion of said second conductive leads and said another supporting portion extend on both sides of said second inner end portion.

9. The leadframe as set forth in claim 8, in which said insulating adhesive compound is spread over a peripheral area of said upper surface in a loop, and said bonding pads are broken down into a first bonding pad group arranged on at least a portion of a central area inside said loop and connected through said bonding wires to said first inner end portions and a second bonding group arranged on outer area outside said loop and connected through said bonding wires to said second inner end portions.

10. The leadframe as set forth in claim 9, in which each of said second inner end portions is connected to at least a respective one of a plurality of bonding pads of said second bonding pad group.

11. The leadframe as set forth in claim 1, in which said supporting portions project from inner ends of said second inner end portions of said second conductive leads, respectively.

12. The leadframe as set forth in claim 11, in which said insulating adhesive compound is spread over side areas on said upper surface, and said bonding pads are broken down into a first bonding pad group arranged on a central area of said upper surface between said side areas and connected through said bonding wires to said first inner end portions and a second bonding group arranged on both sides of said central and side areas and connected through said bonding wires to said second inner end portions.

13. The leadframe as set forth in claim 12, in which each of said second inner end portions is connected to at least a respective one of a plurality of bonding pads of said second bonding pad group.

14. The lead frame as set forth in claim 1, in which said insulating adhesive compound is spread over both surfaces of at least one bonding tape disposed between said conductive leads and said upper surface so that said bonding tape adheres said first inner end portions and the supporting portions of said second conductive leads to said upper surface.

15. A semiconductor device comprising:

a semiconductor chip having an upper surface where bonding pads are formed on at least a central portion; and a leadframe assembled with said semiconductor chip, and including;

a plurality of first conductive leads respectively having first inner end portions projecting into a space over an upper surface of said semiconductor chip and adhered to said upper surface by means of an insulating adhesive compound, a plurality of second conductive leads each having a second inner end portion outside said space and a supporting portion projecting into said space so as to be adhered to said insulating adhesive compound, and a plurality of bonding wires connected between respective ones of said bonding pads formed on said upper surface of said semiconductor chip and corresponding ones of said plurality of first inner end portions and the second inner end portions of said plurality of second conductive leads.

16. The semiconductor device as set forth in claim 15, in which said semiconductor chip assembled with said leadframe are to be sealed.

* * * * *